(12) United States Patent
Kim et al.

(10) Patent No.: US 8,563,390 B2
(45) Date of Patent: Oct. 22, 2013

(54) SEMICONDUCTOR DEVICES AND METHODS OF FABRICATING THE SAME

(71) Applicant: Samsung Electronics Co., Ltd., Suwon-si (KR)

(72) Inventors: Myoungsoo Kim, Hwaseong-si (KR); Yoonkyung Choi, Yongin-si (KR); Eun Young Lee, Yongin-si (KR); Sungil Jo, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/868,752

(22) Filed: Apr. 23, 2013

(65) Prior Publication Data

US 2013/0230963 A1    Sep. 5, 2013

Related U.S. Application Data

(62) Division of application No. 13/009,495, filed on Jan. 19, 2011, now Pat. No. 8,431,982.

(30) Foreign Application Priority Data

Mar. 4, 2010  (KR) .......................  10-2010-0019541

(51) Int. Cl.
*H01L 21/20* (2006.01)
*H01L 27/108* (2006.01)
*H01L 29/94* (2006.01)

(52) U.S. Cl.
USPC ........... 438/395; 438/393; 438/394; 438/250; 438/251; 438/252; 257/306; 257/332; 257/368; 257/637; 257/690

(58) Field of Classification Search
USPC ................... 438/250, 251, 252, 393, 394, 395
See application file for complete search history.

(56) References Cited

U.S. PATENT DOCUMENTS

| | | | |
|---|---|---|---|
| 7,554,134 B2 * | 6/2009 | Cummins | 257/252 |
| 7,675,138 B2 * | 3/2010 | Zhang | 257/532 |
| 7,879,681 B2 * | 2/2011 | Kim et al. | 438/396 |
| 2008/0137262 A1 * | 6/2008 | Mahalingam et al. | 361/301.4 |
| 2012/0037969 A1 * | 2/2012 | Sanders et al. | 257/296 |

* cited by examiner

*Primary Examiner* — Matthew W Such
*Assistant Examiner* — Samuel Lair
(74) *Attorney, Agent, or Firm* — F. Chau & Associates, LLC

(57) ABSTRACT

A semiconductor device includes capacitors connected in parallel. Electrode active portions and a discharge active portion are defined on a semiconductor substrate, and capping electrodes are disposed respectively on the electrode active portions. A capacitor-dielectric layer is disposed between each of the capping electrodes and each of the electrode active portions that overlap each other. A counter doped region is disposed in the discharge active portion. A lower interlayer dielectric covers the entire surface of the semiconductor substrate. Electrode contact plugs respectively contact the capping electrodes through the lower interlayer dielectric, and a discharge contact plug contacts the counter doped region through the lower interlayer dielectric. A lower interconnection is disposed on the lower interlayer dielectric and contacts the electrode contact plugs and the discharge contact plug.

9 Claims, 15 Drawing Sheets

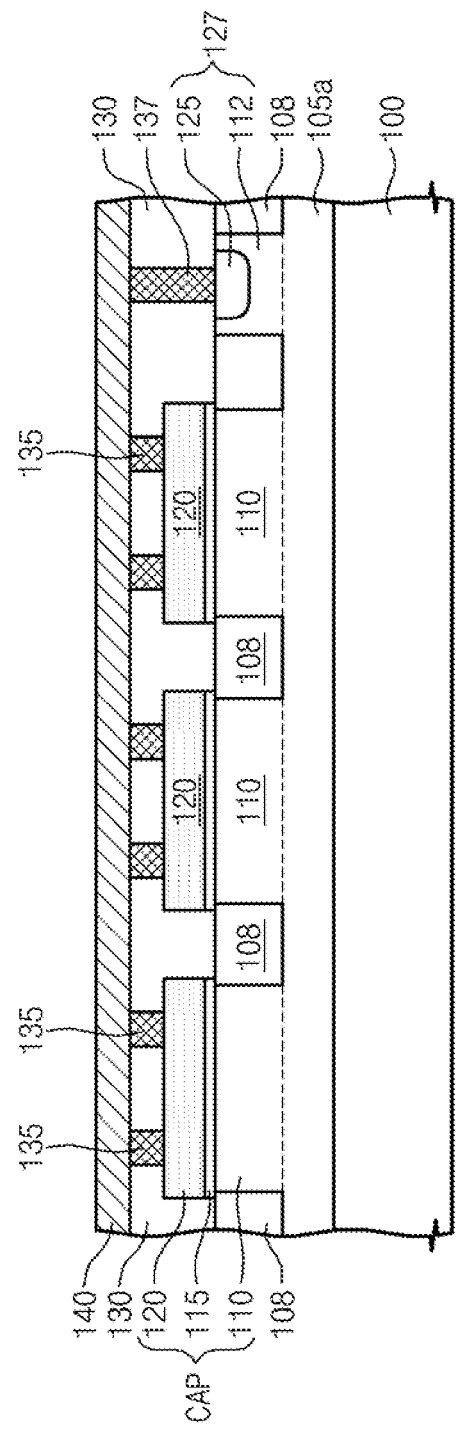

SEMICONDUCTOR DEVICES AND METHODS OF FABRICATING THE SAME

CROSS-REFERENCE TO RELATED APPLICATIONS

This application is a division of U.S. patent application Ser. No. 13/009,495, filed Jan. 19, 2011, which claims priority under 35 U.S.C. §119 to Korean Patent Application No. 10-2010-0019541, filed on Mar. 4, 2010, the entire contents of which are hereby incorporated by reference.

BACKGROUND

1. Technical Field

The present disclosure relates to semiconductor devices, and more particularly, to semiconductor devices and methods of fabricating the same.

2. Discussion of the Related Art

Due to the usefulness of small size, lightweight, low power consumption and/or multifunctional characteristics, semiconductor devices are important elements in the electronic industry. Specifications for the characteristics of semiconductor devices are subject to ever greater expectations. For example, the requirements for the reliability of semiconductor devices are on the increase. The requirements for the operational continuance, operational uniformity and/or durability of semiconductor devices against external environments are on the increase.

However, the reliability of semiconductor devices may degrade due to various factors. For example, the reliability of a semiconductor device may degrade due to the characteristic degradation of each unitary element in the semiconductor device, the interference between the unitary elements, and/or the characteristic degradation of the semiconductor device by external environments. The required characteristics of semiconductor devices are increasingly diversified with the rapid development of the semiconductor industry. Accordingly, factors degrading the reliability of semiconductor devices are increasingly diversified, and the reliability of semiconductor devices is an increasingly important characteristic.

SUMMARY

Exemplary embodiments of the present disclosure provide for semiconductor devices with high reliability and methods of fabricating the same.

Exemplary embodiments of the present disclosure provide semiconductor devices including MOS-type capacitors with improved reliability and methods of fabricating the same.

In some exemplary embodiments of the inventive concept, semiconductor devices include a discharge active portion and a plurality of electrode active portions defined by a device isolation pattern on a semiconductor substrate and doped with a first-type dopant, the electrode active portions being electrically connected to each other. A plurality of capping electrodes is disposed respectively on the electrode active portions. A capacitor-dielectric layer is disposed between each of the capping electrodes and each of the electrode active portions that overlap each other. A counter doped region is disposed in the discharge active portion and are doped with a second-type dopant. A lower interlayer dielectric is disposed on the entire surface of the semiconductor substrate. Each of a plurality of electrode contact plugs respectively contacts the capping electrodes through the lower interlayer dielectric. A discharge contact plug contacts the counter doped region through the lower interlayer dielectric. A lower interconnection is disposed on the lower interlayer dielectric and contacts top surfaces of the electrode contact plugs and the top surface of the discharge contact plug.

In some exemplary embodiments, the semiconductor devices further include a connection doped region doped with the first-type dopant, the connection doped region being disposed in the semiconductor substrate and connected to bottom surfaces of the electrode active portions and the discharge active portion.

In some exemplary embodiments, in an operation mode, a first voltage may be applied to the connection doped region and a second voltage different from the first voltage may be applied to the lower interconnection. Herein, the counter doped region and the discharge active portion may forms a PN junction, and a reverse bias may be provided to the PN junction by the first voltage and the second voltage.

In some exemplary embodiments, parasitic charges in the capping electrodes may be discharged through the lower interconnection, the discharge contact plug, the counter doped region and the discharge active portion.

In some exemplary embodiments, the semiconductor devices may further include an upper interlayer dielectric covering the lower interconnection and the lower interlayer dielectric. An upper interconnection is disposed on the upper interlayer dielectric.

In some exemplary embodiments, there may be a plurality of upper interlayer dielectrics and there may be a plurality of upper interconnections. In this case, the upper interlayer dielectrics and the upper interconnections may be alternately stacked, and the stacked upper interconnections may be electrically connected to the lower interconnection.

In some exemplary embodiments, the semiconductor devices may further include a dummy doped region disposed in the discharge active portion and doped with the second-type dopant. A dummy gate electrode is disposed on the discharge active portion between the counter doped region and the dummy doped region. A dummy gate dielectric layer is disposed between the dummy gate electrode and the discharge active portion.

In some exemplary embodiments, the dummy gate electrode, the dummy doped region and the electrode active portions may be electrically connected to each other.

In some exemplary embodiments, the semiconductor devices may further include a landing active portion defined by the device isolation pattern, spaced apart from the electrode active portions and the discharge active portion, and doped with the first-type dopant. First, second and third contact plugs are connected respectively to the dummy gate electrode, the dummy doped region and the landing active portion through the lower interlayer dielectric. A local interconnection is spaced apart laterally from the lower interconnection and disposed on the lower interlayer dielectric and contact the first, second and third contact plugs. A connection doped region is doped with the first-type dopant and is disposed in the semiconductor substrate and is connected to bottom surfaces of the electrode active portions, the discharge active portion and the landing active portion.

In some exemplary embodiments, the semiconductor devices may further include a heavily-doped region disposed in the landing active portion and doped with the first-type dopant. Herein, the heavily-doped region may have a higher dopant concentration than the landing active portion.

In some exemplary embodiments, the lower interconnection may include a metal.

In some exemplary embodiments of the inventive concept, methods of fabricating a semiconductor device include forming a well region, doped with a first-type dopant, in a semiconductor substrate. A device isolation pattern is formed in the well region and defines a discharge active portion and a plurality of electrode active portions. A capacitor-dielectric layer is formed on the electrode active portions. A plurality of capping electrodes is formed on the capacitor-dielectric layer and covers the electrode active portions. A counter doped region, doped with a second-type dopant, is formed in the discharge active portion. A lower interlayer dielectric is formed covering the entire surface of the semiconductor substrate. An electrode contact plug contacting each of the capping electrodes is formed through the lower interlayer dielectric, and a discharge contact plug contacting the counter doped region is formed through the lower interlayer dielectric. A lower interconnection is formed on the lower interlayer dielectric and contacts the electrode contact plug and the discharge contact plug.

In some exemplary embodiments, parasitic charges in the capping electrodes may be discharged through the lower interconnection, the discharge contact plug, the counter doped region and the discharge active portion.

In some exemplary embodiments, the parasitic charges may be generated by plasma-based processes among the processes performed after the forming of the capping electrodes.

In some exemplary embodiments, after the forming of the lower interconnection, the methods may further include forming an upper interlayer dielectric on the semiconductor substrate. An interconnection contact plug is formed connecting to the lower interconnection through the upper interlayer dielectric. An upper interconnection is formed on the upper interlayer dielectric.

In some exemplary embodiments, the methods may further include forming a dummy gate dielectric layer and a dummy gate electrode sequentially stacked on the discharge active portion. A dummy doped region, doped with the second-type dopant, is formed in the discharge active portion at one side of the dummy gate electrode. Herein, the counter doped region may be formed at the other side of the dummy gate electrode, and the counter doped region may be formed substantially simultaneously with the dummy doped region.

In some exemplary embodiments, the device isolation pattern may further define a landing active portion in the well region. The landing active portion may be spaced apart from the electrode active portions and the discharge active portion. The methods may further include forming first, second and third contact plugs connected respectively to the dummy gate electrode, the dummy doped region and the landing active portion through the lower interlayer dielectric. A local interconnection is formed, connected to the first, second and third contact plugs, on the lower interlayer dielectric. Herein, the local interconnection may be laterally spaced apart from the lower interconnection.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 3A to 3F are cross-sectional views illustrating a method of fabricating a semiconductor device according to an exemplary embodiment of the inventive concept;

DETAILED DESCRIPTION OF EXEMPLARY EMBODIMENTS

Figure 1:
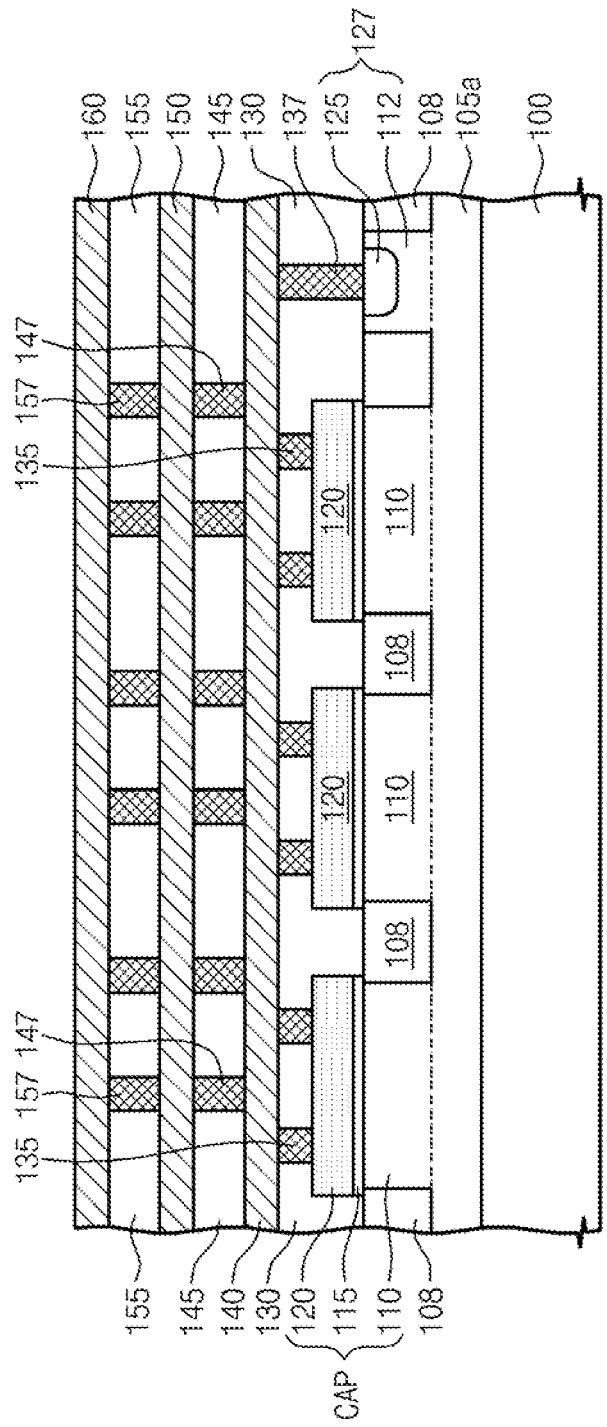
FIG. 1 is a cross-sectional view of a semiconductor device according to an exemplary embodiment of the inventive concept.

Exemplary embodiments of the inventive concept will be described below in more detail with reference to the accompanying drawings. Aspects and features of the inventive concept will be clarified through the following embodiments described with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

It will be understood that when a layer (or film) is referred to as being 'on' another layer or substrate, it can be directly on the other layer or substrate, or one or more intervening layers may also be present. It will also be understood that when a layer is referred to as being 'under' another layer, it can be directly under the other layer, or one or more intervening layers may also be present. It will also be understood that when a layer is referred to as being 'between' two layers, it can be the only layer between the two layers, or one or more intervening layers may also be present. In the drawings, the dimensions of layers (or films) and regions may be exaggerated for clarity of illustration. Throughout the specification, like reference numerals may refer to like elements.

FIG. 1 is a cross-sectional view of a semiconductor device according to an exemplary embodiment of the inventive concept.

Referring to FIG. 1, a device isolation pattern 108 may be disposed in a semiconductor substrate 100. The device isolation pattern 108 defines a discharge active portion 112 and a plurality of electrode active portions 110. The discharge active portion 112 is laterally spaced apart from the electrode active portions 110. The semiconductor substrate 100 may be a silicon substrate. However, the inventive concept is not limited thereto. The semiconductor substrate 100 may be a germanium substrate or a silicon-germanium substrate. The device isolation pattern 108 may fill a trench formed in the semiconductor substrate 100. The device isolation pattern 108 may include oxide, nitride and/or oxynitride.

Each of the electrode active portions 110 and the discharge active portion 112 may correspond to a portion of the semiconductor substrate 100 surrounded by the device isolation pattern 108. The electrode active portions 110 may be arrange two-dimensionally in plan view. The discharge active portion 112 may be disposed at one side of the electrode active portions 110. Alternatively, or additionally, the discharge active portion 112 may be disposed between the electrode active portions 110. For example, the discharge active portion 112 may be located at substantially the same distances from the outermost some of the two-dimensionally arranged electrode active portions 110. The electrode active portions 110 and the discharge active portion 112 are doped with a first-type dopant. The electrode active portions 110 may be electrically connected to each other. Also, the electrode active portions 110 and the discharge active portion 112 may be electrically connected to each other.

A connection doped region 105a may be disposed in or on the semiconductor substrate 100. The connection doped region 105a is doped with the first-type dopant. The connection doped region 105a may be disposed below the device isolation pattern 108, the electrode active portions 110, and/or the discharge active portion 112. The connection doped region 105a may contact bottom surfaces of the electrode active portions 110 and the discharge active portion 112. The electrode active portions 110 and the discharge active portion 112 may be electrically connected to each other by the connection doped region 105a. For example, a well region doped with the first-type dopant is formed in the semiconductor substrate 100, and the device isolation pattern 108 may be formed in the well region to define the electrode active portions 110 and the discharge active portion 112 in the well region. A portion of the well region disposed lower than the device isolation pattern 108, the electrode active portions 110 and the discharge active portion 112 may correspond to the connection doped region 105a.

A plurality of capping electrodes 120 is disposed respectively on the electrode active portions 110. A capacitor-dielectric layer is disposed between each of the electrode active portions 110 and each of the capping electrodes 120 that overlap each other. The electrode active portion 110, capacitor-dielectric layer 115 and capping electrode 120, are sequentially stacked, and may constitute a capacitor CAP. The electrode active portion 110 and capping electrode 120 overlap each other and correspond respectively to the lower electrode and upper electrode of the capacitor. The capacitor CAP includes the electrode active portion 110 and the capping electrode 120, such that the capacitor CAP may be a MOS-type capacitor. A plurality of capacitors CAP may be two-dimensionally arranged at the semiconductor substrate 100 in plan view. The capacitors CAP may be connected in parallel to each other. Hereinafter, the capacitors CAP connected in parallel to each other will be referred to as the parallel capacitors CAP.

The capping electrodes 120 are formed of a conductive material. For example, the capping electrodes 120 may include at least one of a doped semiconductor material (e.g., a doped silicon), a conductive metal nitride (e.g., a titanium nitride and a tantalum nitride) or a conductive metal-semiconductor compound (e.g., a tungsten silicide and a titanium silicide). The capacitor-dielectric layer 115 is formed of a dielectric material. For example, the capacitor-dielectric layer 115 may include at least one of oxide, nitride, oxynitride or a high-k dielectric material (e.g., a dielectric metal oxide such as an aluminum oxide and a hafnium oxide). The capacitor-dielectric layer 115 may have a thickness of about 15 angstroms to about 1500 angstroms.

A counter doped region 125 doped with a second-type dopant is disposed in the discharge active portion 112. The bottom surface of the counter doped region 125 may be higher than the bottom surface of the device isolation pattern 108. For example, the bottom surface of the counter doped region 125 may be higher than the bottom surface of the discharge active portion 112. The second-type dopant is different in type from the first-type dopant. One of the first-type and second-type dopants is an n-type dopant and the other is a p-type dopant. Accordingly, the counter doped region 125 and the discharge active portion 112 may form a PN junction. For example, the counter doped region 125 and the discharge active portion 112 may constitute a PN diode 127.

A lower interlayer dielectric 130 may cover the entire surface of the semiconductor substrate 100. The lower interlayer dielectric 130 may cover the capping electrodes 120, the device isolation pattern 108 and the active portions 110 and 112. The lower interlayer dielectric 130 may include an oxide, a nitride and/or an oxynitride. The top surface of the lower interlayer dielectric 130 may be in a planarized state.

Electrode contact plugs 135 may respectively contact the capping electrodes 120 through the lower interlayer dielectric 130. One electrode contact plug 135 may contact each capping electrode 120. Alternatively, a plurality of electrode contact plugs 135 may be provided on each capping electrode 120. For example, a plurality of electrode contact plugs 135 may contact each capping electrode 120. A discharge contact plug 137 may contact the counter doped region 125 through the lower interlayer dielectric 130. The discharge contact plug 137 may be formed of the same conductive material as the electrode contact plugs 135. For example, the electrode and discharge contact plugs 135 and 137 may include at least one of a doped semiconductor (e.g., a doped silicon), a conductive metal nitride (e.g., a titanium nitride and a tantalum nitride), a conductive metal-semiconductor compound (e.g., a titanium silicide and a tantalum silicide) and a metal (e.g., titanium, tantalum, tungsten, copper and aluminum).

A lower interconnection 140 is disposed on the lower interlayer dielectric 130. The lower interconnection 140 is connected to the electrode contact plugs 135. Also, the lower interconnection 140 is connected to the discharge contact plug 137. For example, the lower interconnection 140 may contact the top surfaces of the electrode contact plugs 135 and the top surface of the discharge contact plug 137. The lower interconnection 140 may be electrically connected to the plurality of the capping electrodes 120 by the electrode contact plugs 135. Thus, the capacitors CAP may be connected in parallel to each other by the lower interconnection 140 and the connection doped region 105a. The lower interconnection 140 may include a metal. For example, the lower interconnection 140 may include at least one of aluminum, tungsten and copper. Also, the lower interconnection 140 may further include a conductive barrier material (e.g., a conductive metal nitride such as a tantalum nitride and a titanium nitride). Also, the lower interconnection 140 may further include an adhesion layer (e.g., titanium or tantalum).

Parasitic charges may be present in the capping electrodes 120. The parasitic charges may be discharged to the counter doped region 125 and the discharge active portion 112 via the lower interconnection 140 and the discharge contact plug 137. The parasitic charges may be discharged through the discharge active portion 112 to the connection doped region 105a and/or the semiconductor substrate 100. The discharge contact plug 137, the counter doped region 125 and the discharge active portion 112 may be used exclusively to discharge the parasitic charges. For example, the discharge contact plug 137, the counter doped region 125 and the discharge active portion 112 may not engage in the operation of the parallel capacitors CAP.

At least one level of upper interlay dielectric and at least one level of lower interconnection may be stacked on the lower interconnection 140 and the lower interlayer dielectric 130. For example, a plurality of interconnections spaced apart from each other may be stacked on the lower interlayer dielectric 130. The upper interlayer dielectric may be disposed between the interconnections adjacent vertically to each other. The lower interconnection 140 is disposed at the lowermost one of the stacked interconnections. As an example, FIG. 1 illustrates a semiconductor device including three levels of interconnections. However, the inventive concept is not limited thereto. According to an exemplary embodiment, the semiconductor device may include two levels of stacked interconnections or four or more layers of stacked interconnections.

Referring to FIG. 1, a first upper interlayer dielectric 145 may be disposed on the lower interconnection 140 and the lower interlayer dielectric 130. The first upper interlayer dielectric 145 may include an oxide. For example, the first upper interlayer dielectric 145 may include an oxide formed by a plasma enhanced chemical vapor deposition (PECVD) process. A first interconnection contact plug 147 may be connected to the lower interconnection 140 through the first upper interlayer dielectric 145. A first upper interconnection 150 may be disposed on the first upper interlayer dielectric 145. The first upper interconnection 150 may be connected to the first interconnection contact plug 147. The first upper interconnection 150 may be electrically connected to the lower interconnection 140 through the first interconnection contact plug 147. A plurality of the first interconnection contact plug 147 may be provided in the first upper interlayer dielectric 145 between the first upper interconnection 150 and the lower interconnection 140. Accordingly, the first upper interconnection 150 may be electrically connected to the lower interconnection 140 by the first interconnection contact plugs 147. The first interconnection contact plug 147 may include a metal (e.g., tungsten, aluminum and/or copper). Also, the first interconnection contact plug 147 may further include a conductive barrier material (e.g., a titanium nitride and a tantalum nitride) and/or an adhesion layer (e.g., titanium and tantalum). The first upper interconnection 150 may include a metal (e.g., tungsten, aluminum and/or copper). Also, the first upper interconnection 150 may further include a conductive barrier material (e.g., a titanium nitride and a tantalum nitride) and/or an adhesion layer (e.g., titanium and tantalum).

A second upper interlayer dielectric 155 may be disposed on the first upper interconnection 150 and the first upper interlayer dielectric 145. The second upper interlayer dielectric 155 may include an oxide (e.g., an oxide formed by a PECVD process). A second interconnection contact plug 157 may be connected to the first upper interconnection 150 through the second upper interlayer dielectric 155. A second upper interconnection 160 may be disposed on the second upper interlayer dielectric 155. The second upper interconnection 160 may be connected to the second interconnection contact plug 157. The second upper interconnection 160 may be electrically connected to the lower interconnection 140 through the second interconnection contact plug 157 and the first upper interconnection 150. The second interconnection contact plug 157 may be provided in plurality in the second upper interlayer dielectric 155 between the second upper interconnection 160 and the first upper interconnection 150. The second upper interconnection 160 may be electrically connected to the first upper interconnection 150 through the second interconnection contact plugs 157. The second interconnection contact plug 157 may include a metal (e.g., tungsten, aluminum and/or copper). Also, the second interconnection contact plug 157 may further include a conductive barrier material (e.g., a titanium nitride and a tantalum nitride) and/or an adhesion layer (e.g., titanium and tantalum). The second upper interconnection 160 may include a metal (e.g., tungsten, aluminum and/or copper). Also, the second upper interconnection 160 may further include a conductive barrier material (e.g., a titanium nitride and a tantalum nitride) and/or an adhesion layer (e.g., titanium and tantalum).

According to the above-described semiconductor device, parasitic charges, that may be present in the capping electrodes 120, may be discharged through the counter doped region 125 and the discharge active portion 112 via the discharge contact plug 137 and the lowermost lower interconnection 140 among the interconnections 140, 150 and 160. Accordingly, the semiconductor device can have high reliability. The parasitic charges may be generated by the semiconductor device fabrication processes that are performed after the forming of the capping electrodes 120. For example, the parasitic charges may be generated by the plasma-based subsequent processes among the subsequent processes. For example, charges generated by plasma used in the subsequent process may be accumulated in the capping capacitors 120 to generate the parasitic charges.

If the parasitic charges are accumulated in the capping electrodes 120, the accumulated parasitic charges may cause defects in the capacitor CAP including the capping electrode 120, the capacitor-dielectric layer 115 and the electrode active portion 110. For example, the accumulated parasitic charges may degrade the capacitor-dielectric layer 115 to degrade the characteristics of the capacitor CAP. However, according to an exemplary embodiment of the inventive concept, the parasitic charges are discharged through the lower interconnection 140, the discharge contact plug 137, the counter doped region 125 and the discharge active portion 112. Accordingly, the characteristic degradation of the capacitors CAP can be minimized. Consequently, a semiconductor device with high reliability can be implemented.

Also, the parasitic charges are discharges through the discharge contact plug 137 and the lowermost lower interconnection 140 among the interconnections 140, 150 and 160, thereby minimizing the discharge path of the parasitic charges. Accordingly, the parasitic charges can be discharged very rapidly, thus making it possible to implement a semiconductor device with high reliability.

As described above, the lower interconnection 140, the discharge contact plug 137, the counter doped region 125 and the discharge active portion 112 may be used to discharge the parasitic charges, and may not engage in the operation of the parallel capacitors CAP. This will be described below in detail with reference to FIGS. 2A and 2B.

Figure 2A:
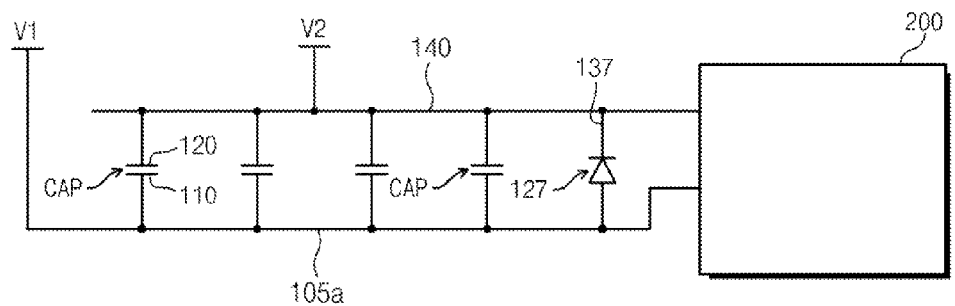
FIG. 2A is a circuit diagram of an example of a semiconductor device according to an exemplary embodiment of the inventive concept.

FIG. 2A is a circuit diagram of an example of a semiconductor device according to an exemplary embodiment of the inventive concept.

Referring to FIGS. 1 and 2A, capping electrodes 120 corresponding to one terminals of capacitors CAP may be electrically connected to each other by a lower interconnection 140, and electrode active portions 110 corresponding to the other terminals of the capacitors CAP may be electrically connected to each other by a connection doped region 105a. Accordingly, the capacitors CAP are connected in parallel to each other as illustrated in FIG. 2A. Both terminals of a PN diode 127 by the PN junction of the counter doped region 125 and the discharge active portion 112 may be respectively connected to the lower interconnection 140 and the connection doped region 105a. One terminal of the PN diode 127 and the lower interconnection 140 may be connected by the discharge contact plug 137.

In an operation of the semiconductor device (i.e., an operation of the parallel capacitors CAP), a first voltage V1 may be applied to the connection doped region 105a and a second voltage V2 may be applied to the lower interconnection 140. The first voltage V1 and the second voltage V2 are different from each other. The first voltage V1 may be a reference voltage. The second voltage V2 may be applied to the lower interconnection 140 via the second and first upper interconnections 160 and 150. Although not illustrated in the drawings, the first voltage V1 may be supplied to the connection doped region 105*a* through a contact structure (not illustrated) that is formed in the upper interlayer dielectrics 155 and 145 and the lower interlayer dielectric 130 and is connected to the connection doped region 105*a*. The absolute value of the difference between the first voltage V1 and the second voltage V2 may be about 1.5 V to about 100 V.

A reverse bias is provided to the PN diode 127 by the first and second voltages V1 and V2. For example, as illustrated in FIG. 2A, if the second voltage V2 is higher than the first voltage V1, the PN diode 127 may be disposed such that a current flowing from the lower interconnection 140 to the connection doped region 105*a* is blocked. If the second voltage V2 is higher than the first voltage V1, the first-type dopant may be a p-type dopant and the second-type dopant may be an n-type dopant. That is, the discharge active portion 112 may be doped with a p-type dopant, and the counter doped region 125 may be doped with an n-type dopant. Because the reverse bias is provided to the PN diode 127 by the first and second voltages V1 and V2, a current does not flow through the PN diode 127. Consequently, the PN diode 127 may not engage in the operation of the parallel capacitors CAP.

One end of the lower interconnection 140 and one end of the connection doped region 105*a* may be electrically connected to an integrated circuit 200. Accordingly, the first and second voltages V1 and V2 may be provided to the integrated circuit 200 via the parallel capacitors CAP. The integrated circuit 200 may be a logic circuit, a driving circuit and/or a memory cell array. In this case, the parallel capacitors CAP may be decoupling capacitors that stably supply the first and second voltages V1 and V2. However, the inventive concept is not limited thereto. According to an exemplary embodiment, the parallel capacitors CAP may be included in a boosting circuit that boosts a voltage. The semiconductor device of FIG. 1 may further include a region for the integrated circuit 200. FIG. 2 illustrates that the PN diode 127 including the counter doped region 125 and the discharge active portion 112 is disposed at one side of the parallel capacitors CAP. However, the inventive concept is not limited thereto. As described with reference to FIG. 1, the PN diode 127 may be disposed between the parallel capacitors CAP.

On the other hand, the first voltage V1 may be higher than the second voltage V2. This will be described below with reference to the drawings.

Figure 2B:
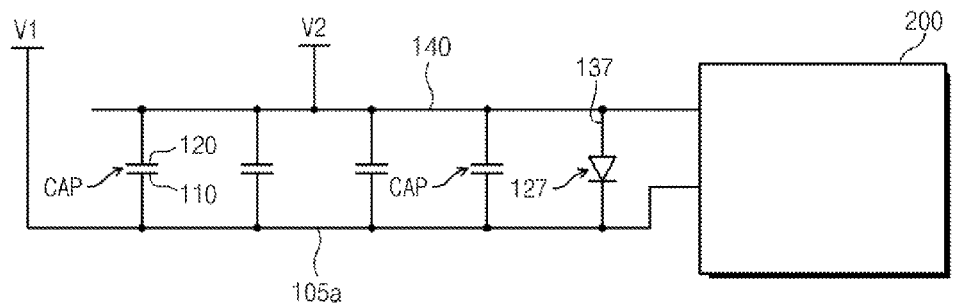
FIG. 2B is a circuit diagram of an example of a semiconductor device according to an exemplary embodiment of the inventive concept.

FIG. 2B is a circuit diagram of an example of a semiconductor device according to an exemplary embodiment of the inventive concept.

Referring to FIGS. 1 and 2B, if the first voltage V1 is higher than the second voltage V2, a PN diode 127 by the PN junction of a counter doped region 125 and a discharge active portion 112 may be disposed such that a current flowing from the connection doped region 105*a* to the lower interconnection 140 is blocked, as illustrated in FIG. 2 B. In this case, the first-type dopant may be an n-type dopant and the second-type dopant may be a p-type dopant. For example, the discharge active portion 112 may be doped with an n-type dopant, and the counter doped region 125 may be doped with a p-type dopant.

Hereinafter, a description will be given of a method of fabricating a semiconductor device according to an exemplary embodiment of the inventive concept.

FIGS. 3A to 3F are cross-sectional views illustrating a method of fabricating a semiconductor device according to an exemplary embodiment of the inventive concept.

Figure 3A:
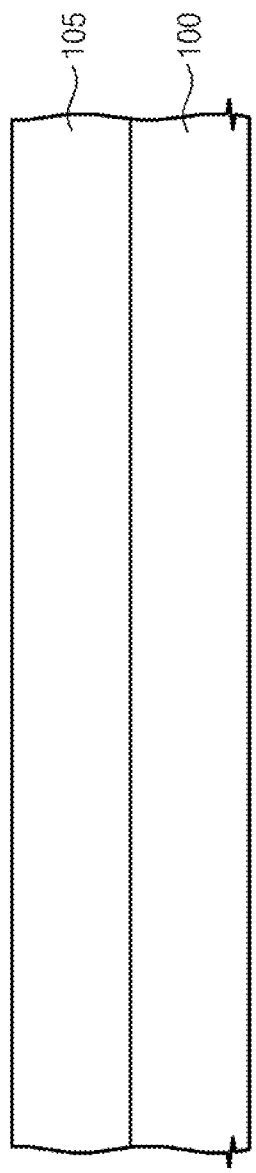

Referring to FIG. 3A, a well region 105 doped with a first-type dopant may be formed in a semiconductor substrate 100. The well region 105 may be formed by implanting the first-type dopant into the semiconductor substrate 100 through an ion implantation process.

Figure 3B:
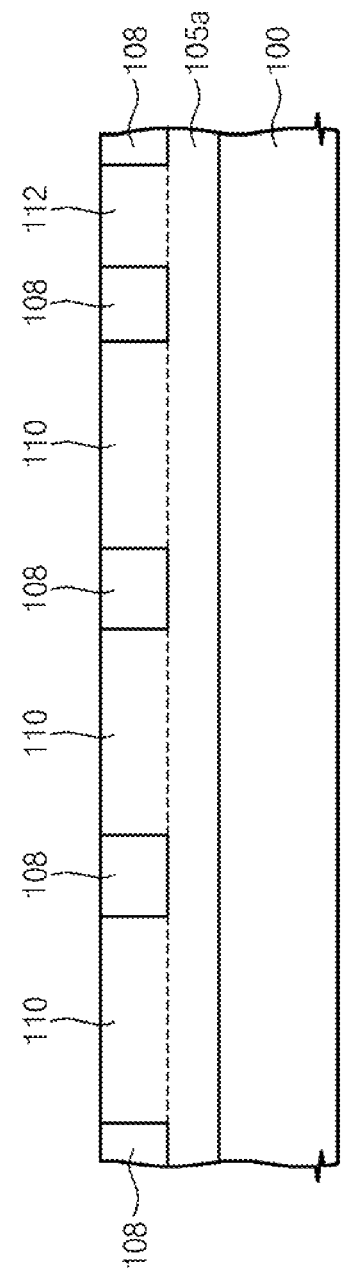

Referring to FIG. 3B, a device isolation pattern 108 may be formed in the well region 105 and may define a discharge active portion 112 and a plurality of electrode active portions 110. The electrode active portions 110 may be spaced apart from each other. Also, the discharge active portion 112 may be spaced apart from the electrode active portions 110. Each of the active portions 110 and 112 may be a portion of the semiconductor substrate 100 surrounded by the device isolation pattern 108. Because the device isolation pattern 108 is formed in the well region 105, the active portions 110 and 112 are doped with the first-type dopant. A portion of the well region 105 located under the device isolation pattern 108 and the active portions 110 and 112 may correspond to a connection doped region 105*a* described above with reference to FIG. 1.

Figure 3C:
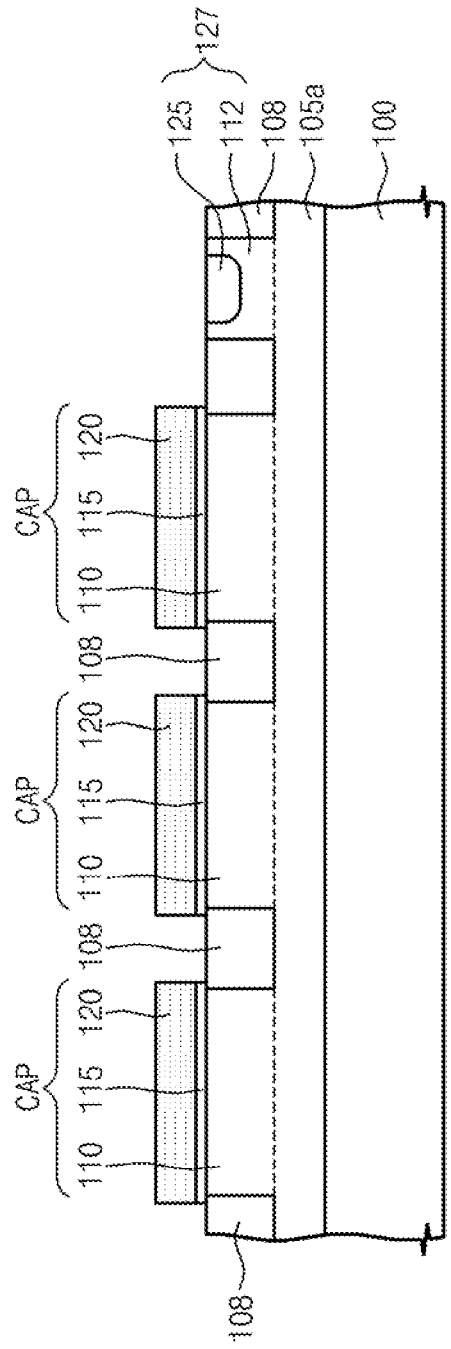

Referring to FIG. 3C, a capacitor-dielectric layer 115 is formed on the entire surface of the semiconductor substrate 100, and an electrode conductive layer is formed on the capacitor-dielectric layer 115. The electrode conductive layer and the capacitor-dielectric layer 115 are sequentially patterned thereby forming capping electrodes 120. The capping electrodes 120 may be disposed respectively on the electrode active portions 110.

A second-type dopant may be implanted into the discharge active portion 112 thereby forming a counter doped region 125. The counter doped region 125 and the discharge active portion 112 may form a PN-junction constituting a PN diode 127. The counter doped region 125 may be formed before the forming of the capacitor-dielectric layer 115 or after the forming of the capping electrodes 120.

Referring to FIG. 3D, a lower interlayer dielectric 130 is formed on the semiconductor substrate 100 having the capping electrodes 120 and the counter doped region 125. Thereafter, electrode contact plugs 135 and a discharge contact plug 137 is formed piercing the lower interlayer dielectric 130. The electrode contact plugs 135 contact the capping electrodes 120, and the discharge contact plug 137 contacts the counter doped region 125. The lower interlayer dielectric 130 may be patterned such that contact holes that respectively expose the capping electrode 120 and the counter doped region 122 are formed. A conductive layer may be formed filling the contact holes. The conductive layer may be planarized forming the electrode and discharge contact plugs 135 and 137.

Thereafter, a lower interconnection 140 is formed on the lower interlayer dielectric 130. The lower interconnection may contact the top surfaces of the electrode contact plugs 135 and the top surface of the discharge contact plug 137. A lower conductive layer may be formed on the lower interlayer dielectric 130, and the lower conductive layer may be patterned forming the lower interconnection 140. The patterning of the lower conductive layer may include a photolithography process and an anisotropic etching process.

Parasitic charges that may be present in the capping electrodes 120 may be discharged through the lower interconnection 140, the discharge contact plug 137, the counter doped region 125 and the discharge active portion 112.

The parasitic charges may be generated by plasma of the subsequent process after the forming of the capping electrode 120. For example, the parasitic charges may be formed by plasma used in the patterning process for forming the contact holes for the contact plugs 135 and 137 (e.g., plasma used in the anisotropic etching process included in the patterning process), and/or plasma used in the patterning process for forming the lower interconnection 140 (e.g., plasma used in the anisotropic etching process including in the patterning process).

Figure 3E:
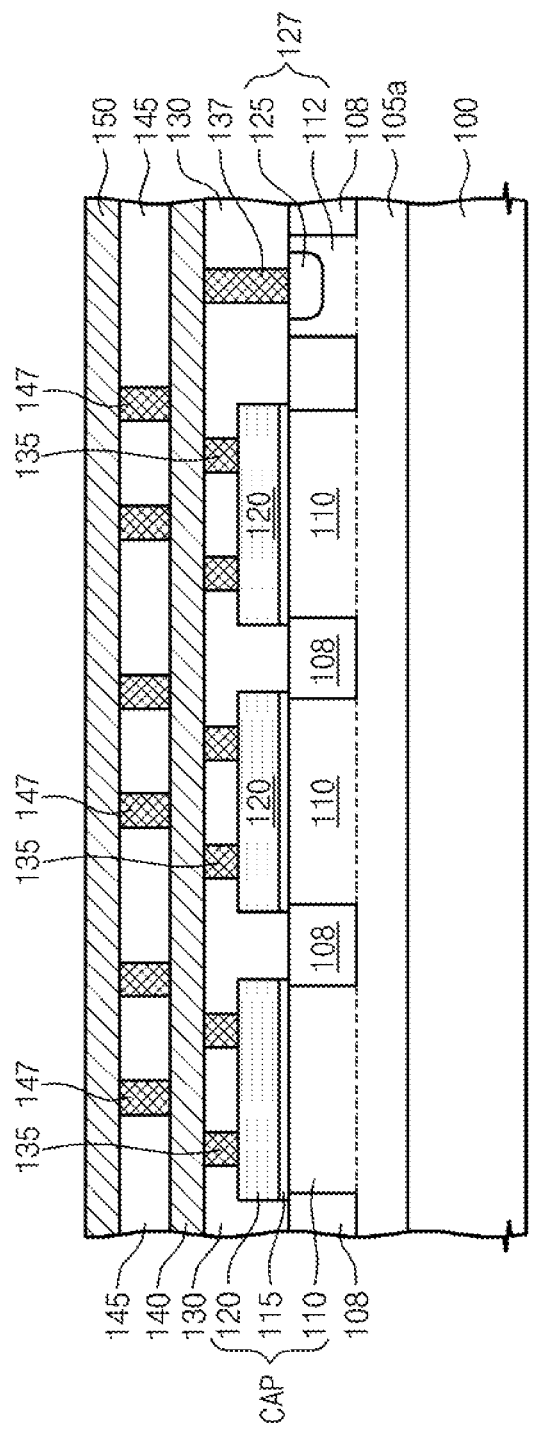

Referring to FIG. 3E, a first upper interlayer dielectric 145 may be formed on the first semiconductor substrate 100 having the lower interconnection 140. The first upper interlayer dielectric 145 may include an oxide layer. Specifically, the first upper interlayer dielectric 145 may include an oxide layer formed through a PECVD process. If the first upper interlayer dielectric 145 is formed through a PECVD process, parasitic charges caused by a plasma damage may be generated in the capping electrodes 120. Herein, the parasitic charges may be rapidly discharged to the counter doped region 125 and the discharge active portion 112 through the lower interconnection 140 and the discharge contact plug 137. For example, during the performing the PECVD process for the first upper interlayer dielectric 145, the semiconductor substrate 100 may be disposed on a grounded chuck in a process chamber. In this case, the parasitic charges discharged to the counter doped region 125 and the discharge active portion 112 may be discharged to the grounded chuck through the semiconductor substrate 100.

At least one first interconnection contact plug 147 may be formed connected to the lower interconnection 140 through the first upper interlayer dielectric 145. The first upper interlayer dielectric 145 may be patterned forming a first interconnection contact hole exposing the lower interconnection 140, and the first interconnection contact plug 147 may be formed filling the first interconnection contact hole.

A first upper interconnection 150 may be formed on the first upper interlayer dielectric 145. The first upper interconnection 150 may contact the top surface of the first interconnection contact plug 147. A first upper conductive layer may be formed on the first upper interlayer dielectric 145, and the first upper conductive layer may be patterned forming the first upper interconnection 150.

When the processes for forming the first interconnection contact plug 147 and the processes for forming the first upper interconnection 150 use plasma, parasitic charges may be generated by the plasma. The parasitic charges may be discharged through the lower interconnection 140, the discharge contact plug 137, the counter doped region 125 and the discharge active portion 112.

Figure 3F:
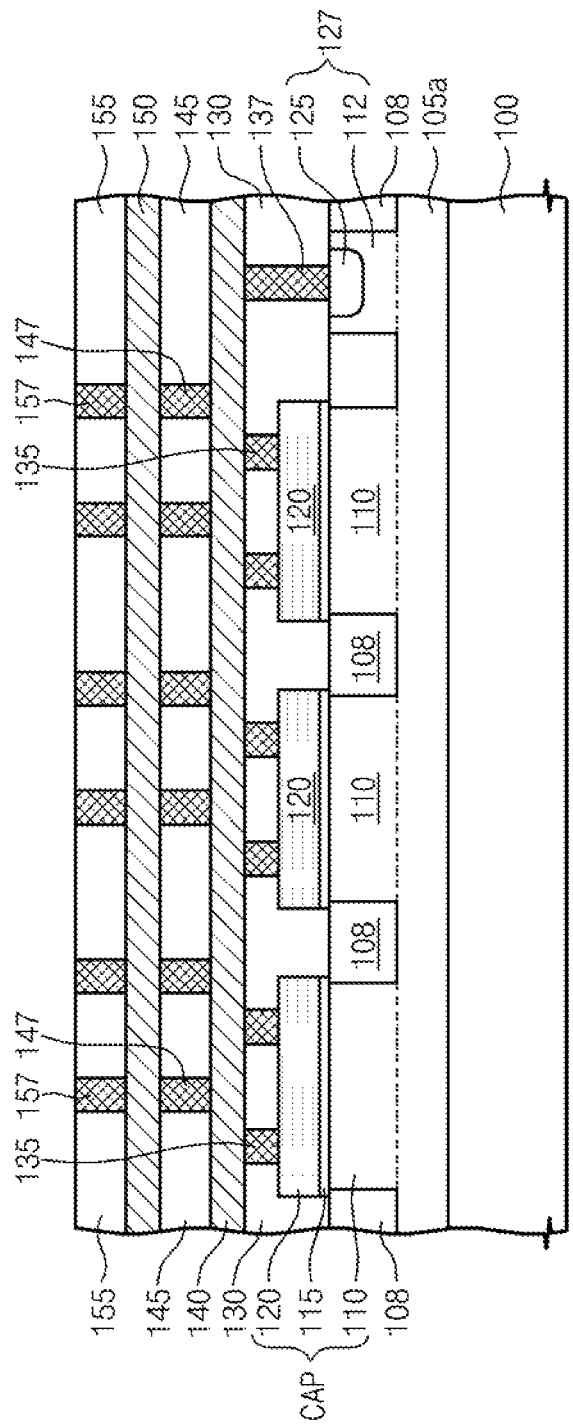

Referring to FIG. 3F, a second upper interlayer dielectric 155 may be formed covering the semiconductor substrate 100. The second upper interlayer dielectric 155 may include an oxide layer. Specifically, the second upper interlayer dielectric 155 may include an oxide layer formed through a PECVD process. A second interconnection contact plug 157 may be formed connected to the first upper interconnection 150 through the second upper interlayer dielectric 155. The second interconnection contact plug 157 may be formed in plurality. The second upper interlayer dielectric 155 may be patterned forming a second interconnection contact hole exposing the first upper interconnection 150, and the second interconnection contact plug 157 may be formed filling the second interconnection contact hole. The patterning process for forming the second interconnection contact hole may include a photolithography process and a plasma-based anisotropic etching process. Thereafter, the second upper interconnection 160 of FIG. 1 may be formed on the second upper interlayer dielectric 155. Accordingly, the semiconductor device illustrated in FIG. 1 may be formed. The forming of the second upper interconnection 160 may include forming a second upper conductive layer on the second upper interlayer dielectric 155 and patterning the second upper conductive layer.

When the second upper interlayer dielectric 155 is formed through a PECVD process, parasitic charges may be generated by the plasma. The parasitic charges may be accumulated in the capping electrode 120 via the first upper interconnection 150 and the lower interconnection 140. The parasitic charges in the capping electrode 120 may be discharge through the lower interconnection 140, the discharge contact plug 137, the counter doped region 125 and the discharge active portion 112. Likewise, parasitic charges, which are generated by a plasma damage that may be caused in the forming process of the second interconnection contact hole and/or the forming process of the second upper interconnection 160, may be discharged via the lower interconnection 140 and the discharge contact plug 137.

According to the method for forming a semiconductor device described above, parasitic charges that are generated by plasma used in a semiconductor process after the forming of the capping electrodes 120 may be discharged through the discharge contact plug 137 and the lower interconnection 140 connected to the capping electrodes 120. Accordingly, a semiconductor device with high reliability can be implemented.

Figure 4:
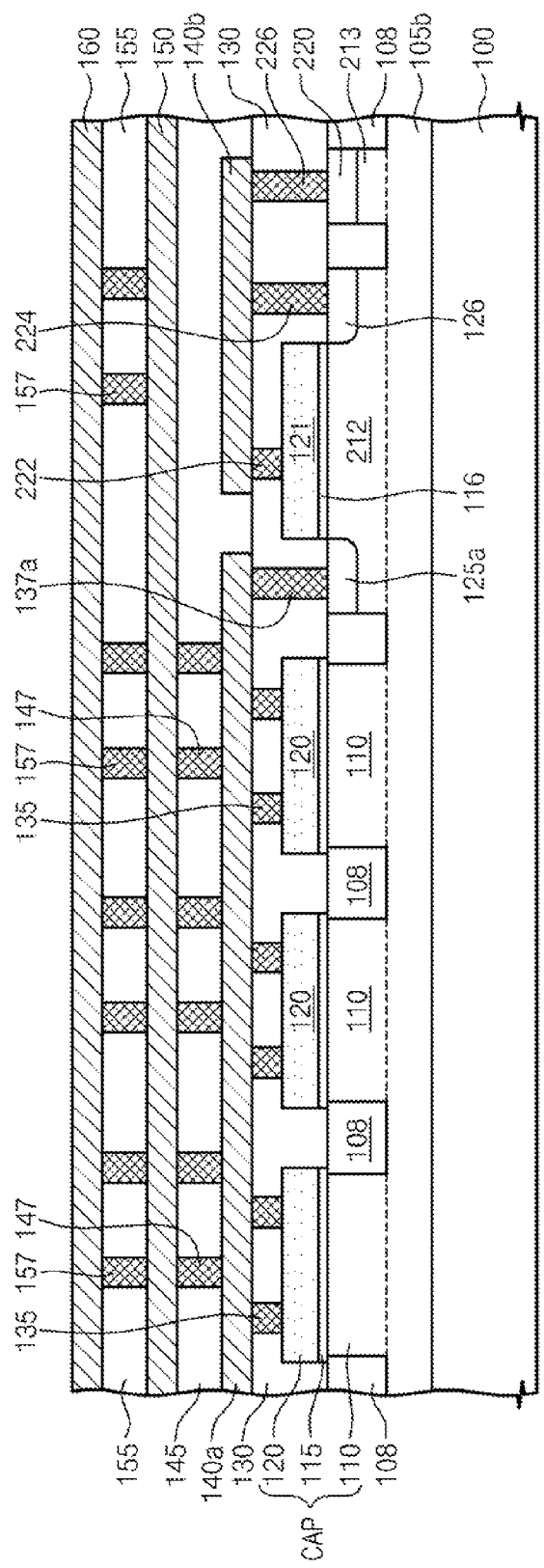
FIG. 4 is a cross-sectional view of a semiconductor device according to an exemplary embodiment of the inventive concept.

FIG. 4 is a cross-sectional view of a semiconductor device according to an exemplary embodiment of the inventive concept.

Referring to FIG. 4, a device isolation pattern 108 may be disposed defining a plurality of electrode active portions 110, a discharge active portion 212 and a landing active portion 213 in a semiconductor substrate 100. The electrode active portions 110, the discharge active portion 212 and the landing active portion 213 may be spaced apart from each other. Each of the active portions 110, 212 and 213 may correspond to a portion of the semiconductor substrate 100 surrounded the device isolation pattern 108. The electrode, discharge and landing active portions 110, 212 and 213 may be doped with a first-type dopant, and may be electrically connected to each other. A connection doped region 105*b* may be disposed in the semiconductor substrate 100. The connection doped region 105*b* may be doped with the first-type dopant, and may contact the bottom surfaces of the active portions 110, 212 and 213. The active portions 110, 212 and 213 may be electrically connected to each other by the connection doped region 105*b*.

A plurality of capping electrodes 120 are disposed respectively on the electrode active portions 110, and a capacitor-dielectric layer 115 is disposed between each the electrode active portion 110 and each the capping electrode 120 that overlap each other. As described above with respect to FIGS. 1-3, the sequentially-stacked electrode active portion 110, capacitor-dielectric layer 115 and capping electrode 120 constitute a capacitor CAP.

A dummy gate electrode 121 may be disposed on the discharge active portion 212, and a dummy gate dielectric layer 116 may be disposed between the dummy gate electrode 121 and the discharge active portion 212. The dummy gate electrode 121 may be formed of the same material as the capping electrode 120. The dummy gate dielectric layer 116 may be formed of the same material as the capacitor-dielectric layer 115. According to an exemplary embodiment, the dummy gate electrode 121 may have substantially the same size as the capping electrode 120.

A counter doped region 125*a* may be disposed in the discharge active portion 212 at one side of the dummy gate electrode 121, and a dummy doped region 126 may be disposed in the discharge active portion 212 at the other side of the dummy gate electrode 121. The counter doped region 125a and the dummy doped region 126 are doped with a second-type dopant. The dummy gate electrode 121, the counter doped region 125a and the dummy doped region 126 may be included in a dummy transistor. The counter doped region 125a may correspond to a first source/drain of the dummy transistor, and the dummy doped region 126 may correspond to a second source/drain of the dummy transistor. The dummy gate electrode 121 and the dummy doped region 126 may be electrically connected to the electrode active portions 110. Thus, the dummy gate electrode 121 and the dummy doped region 126 may also be electrically connected to the discharge active portion 212. The dummy gate electrode 121 and the dummy doped region 126 may be electrically connected to the electrode active portions 110 and the discharge active portion 212 via the landing active portion 213 and the connection doped region 105b.

One of the first-type and second-type dopants is an n-type dopant, and the other is a p-type dopant. Thus, the counter doped region 125a and the discharge active portion 212 forms a PN junction.

A lower interlayer dielectric 130 may be disposed over the semiconductor substrate 100 including the capping electrodes 120 and the dummy gate electrode 121. As described above with respect to FIGS. 1-3, electrode contact plugs 135 may respectively contact the capping electrodes 120 through the lower interlayer dielectric 130. A discharge contact plug 137a may contact the counter doped region 125a through the lower interlayer dielectric 130. A lower interconnection 140a is disposed on the lower interlayer dielectric 130. The lower interconnection 140a may contact the top surfaces of the electrode contact plugs 135 and the top surface of the discharge contact plug 137a. Accordingly, the capping electrodes 120 may be electrically connected to each other by the lower interconnection 140a. The capacitors CAP may be connected in parallel to each other by the lower interconnection 140a and the connection doped region 105b.

A local interconnection 140b may be disposed on the lower interlayer dielectric 130. The local interconnection 140b may be laterally spaced apart from the lower interconnection 140a. The local interconnection 140b may be electrically insulated from the lower interconnection 140a. The local interconnection 140b may be located at the same level as the lower interconnection 140a.

The dummy gate electrode 121, the dummy doped region 126 and the connection doped region 105b may be electrically connected to each other by the local interconnection 140b. For example, a first contact plug 222, a second contact plug 224 and a third contact plug 226 may penetrate the lower interlayer dielectric 130. The first contact plug 222 may be connected to the dummy gate electrode 121. The second contact plug 224 may be connected to the dummy doped region 126. The third contact plug 226 may be connected to the landing active portion 213. The local interconnection 140b may contact top surfaces of the first, second and third contact plugs 222, 224 and 226. A heavily-doped region 220 doped with the first-type dopant may be disposed in the landing active portion 213. For example, the heavily-doped region 220 is doped with the same-type dopant as the landing active portion 213. The heavily-doped region 220 has a higher dopant concentration than the landing active portion 213. The third contact plug 226 may contact the heavily-doped region 220. The contact resistance between the third contact plug 226 and the landing active portion 213 may be reduced by the heavily-doped region 220.

The discharge contact plug 137a may be formed of the same material as the electrode contact plug 135. The first, second and third contact plugs 222, 224 and 226 may also be formed of the same material as the electrode contact plug 135. The lower interconnection 140b is formed of the same material as the lower interconnection 140 described above with respect to FIGS. 1-3. The local interconnection 140b may be formed of the same material as the lower interconnection 140a.

Parasitic charges may be present in the capping electrodes 120. The parasitic charges may be discharged to the discharge active portion 212 via the lower interconnection 140a, the discharge contact plug 137a and the counter doped region 125a. The parasitic charges may be discharged to the outside through the semiconductor substrate 100 and/or the connection doped region 105b. A dummy transistor including the dummy gate electrode 121 does not engage in the operation of the parallel capacitors. Specifically, because the dummy gate electrode 121 and the dummy doped region 126 are electrically connected to each other, the dummy transistor may not operate when the semiconductor device operates. Also, because the counter doped region 125a and the discharge active portion 212 form a PN junction, a current may not flow through the discharge contact plug 137a even when the different first and second voltages are applied respectively to the connection doped region 105h and the lower interconnection 140a.

Referring to FIG. 4, a first upper interlayer dielectric 145 may be disposed on the lower interconnection 140a, the local interconnection 140b and the lower interlayer dielectric 130, and at least one first interconnection contact plug 147 may be connected to the lower interconnection 140a through the first upper interlayer dielectric 145. A first upper interconnection 150 may be disposed on the first upper interlayer dielectric 145 contacting the top surface of the first interconnection contact plug 147. Accordingly, the first upper interconnection 150 may be electrically connected to the lower interconnection 140a. The first upper interconnection 150 may be insulated from the local interconnection 140b.

A second upper interlayer dielectric 155 may be disposed on the first upper interconnection 150 and the first upper interlayer dielectric 145, and at least second interconnection contact plug 157 may be connected to the first upper interconnection 150 through the second upper interlayer dielectric 155. A second upper interconnection 160 may be disposed on the second upper interlayer dielectric 155 and may contact the top surface of the second interconnection contact plug 157. The second upper interconnection 160 may be electrically connected to the lower interconnection 140a via the upper interconnection 150.

FIG. 4 illustrates three levels of stacked interconnections 140a, 150 and 160. Herein, the lower interconnection 140a may be located at the lowermost one of the stacked interconnections 140a, 150 and 160. As described above with respect to FIGS. 1-3, the semiconductor device according to an exemplary embodiment may include two levels of stacked interconnections or four or more levels of stacked interconnections. Also, in this case, the lower interconnection 140a may be located at the lowermost one of the stacked interconnections.

In the above-described semiconductor device, the parasitic charges that may be present in the capping electrodes 120 may be discharged to the semiconductor substrate 100 and/or the connection doped region 105b through the lowermost lower interconnection 140a among the interconnections 140a, 150 and 160 and the discharge contact plug 137a connected thereto. Consequently, a semiconductor device with high reliability can be implemented. Also, the lowermost lower interconnection 140a and the discharge contact plug 137a can minimize the discharge path of the parasitic charges. The parasitic charges may be generated in the same way as described above with respect to FIGS. 1-3.

As described above, the discharge contact plug 137a may be used only to discharge the parasitic charges, and may not engage in the operation of the semiconductor device (e.g., the operation of the parallel capacitors). This will be described below in detail with reference to FIG. 5.

Figure 5:
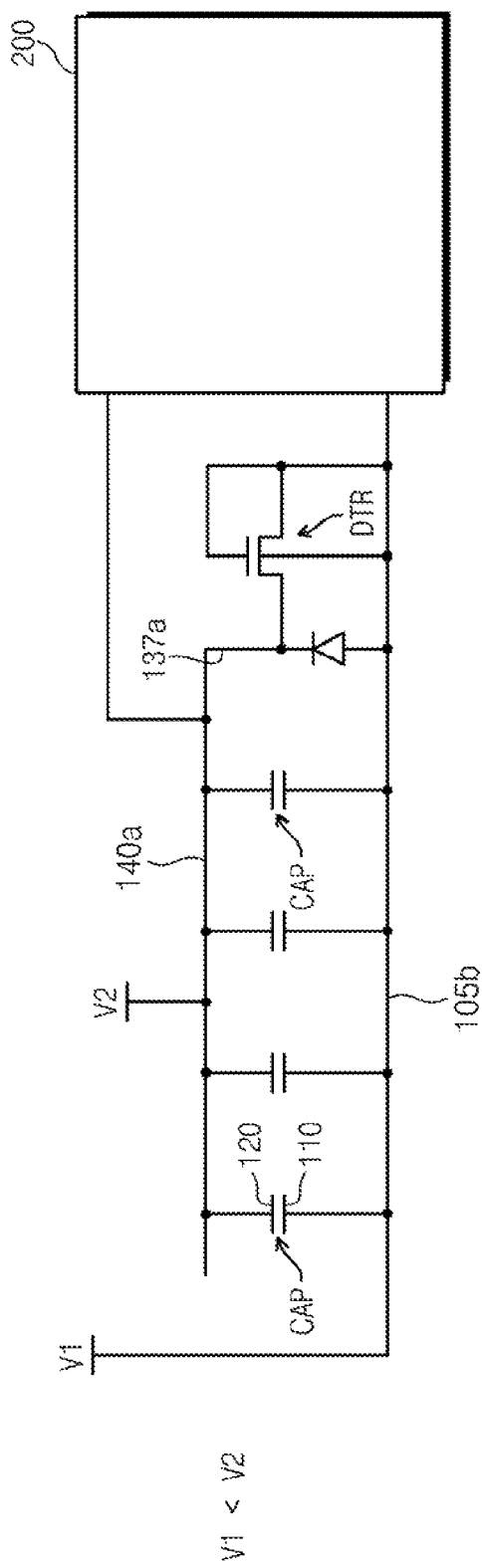
FIG. 5 is a circuit diagram of a semiconductor device according to an exemplary embodiment of the inventive concept.

FIG. 5 is a circuit diagram of a semiconductor device according to an exemplary embodiment of the inventive concept.

Referring to FIGS. 4 and 5, a plurality of capacitors CAP may be connected in parallel to each other by a lower interconnection 140a and a connection doped region 105b. In FIG. 5, a reference symbol 'DTR' denotes a dummy transistor DTR including the dummy doped region 126, the counter doped region 125a and the dummy gate electrode 121 of FIG. 4. The counter doped region 125a (corresponding to a first source/drain) of the dummy transistor DTR is electrically connected to the lower interconnection 140a by a discharge contact plug 137a. The counter doped region 125a of the dummy transistor DTR may form a PN junction with a discharge active portion 212 to constitute a PN diode. The dummy doped region 126 (corresponding to a second source/drain) of the dummy transistor DTR may be electrically connected to the dummy gate electrode 121 (corresponding to the gate) of the dummy transistor DTR. The dummy gate electrode 121 and the dummy doped region 126 of the dummy transistor DTR may be electrically connected to the connection doped region 105b. The discharge active portion 212 may also be connected to the connection doped region 105b. Accordingly, a body region of the dummy transistor DTR may also be connected to the connection doped region 105b. A channel region may be defined in the body region of the dummy transistor DTR.

In an operation of the semiconductor device, a first voltage V1 is applied to the connection doped region 105b and a second voltage V2 is applied to the lower interconnection 140a. The first voltage V1 and the second voltage V2 are different from each other. A PN diode by the PN junction of the counter doped region 125a and the discharge active portion 212 may be disposed for being provided a reverse bias by the first and second voltages V1 and V2.

As illustrated in FIG. 5, according to an exemplary embodiment, the second voltage V2 may be higher than the first voltage V1. In this case, the PN diode by the counter doped region 125a and the discharge active portion 212 may be disposed blocking a current flowing from the lower interconnection 140a to the connection doped region 105b. In this case, the first-type dopant may be a p-type dopant and the second-type dopant may be an n-type dopant. Accordingly, the counter doped region 125a may be doped with an n-type dopant, and the discharge active portion 212 may be doped with a p-type dopant. Also, the dummy transistor DTR may be an NMOS transistor. The body region, the dummy gate electrode 121 and the dummy doped region 126 of the dummy transistor DTR may be provided with the same voltage when the first voltage V1 is supplied thereto. Accordingly, the dummy transistor DTR may also become an off state.

Consequently, the dummy transistor DTR and the PN diode by the counter doped region 125a and the discharge active portion 212 are all turned off in an operation of the semiconductor device. Accordingly, the dummy transistor DTR and the PN diode may not engage in the operation of the semiconductor device (e.g., the operation of the parallel capacitors CAP, and the discharge contact plug 137a and the counter doped region 125a may be used only to discharge the parasitic charges.

As illustrated in FIG. 5, one end of the lower interconnection 140a and one end of the connection doped region 105b may be electrically connected to an integrated circuit 200. Accordingly, the first and second voltages V1 and V2 may be provided to the integrated circuit 200 via the parallel capacitors CAP. The integrated circuit 200 may be a logic circuit, a driving circuit and/or a memory cell array. In this case, the parallel capacitors CAP may be decoupling capacitors that stably supply the first and second voltages V1 and V2. However, the inventive concept is not limited thereto. The parallel capacitors CAP may be included in a boosting circuit that boosts a voltage. The semiconductor device of FIG. 4 may further include a region for the integrated circuit 200.

According to an exemplary embodiment, the first voltage V1 may be higher than the second voltage V2. In this case, the first-type dopant may be an n-type dopant and the second-type dopant may be a p-type dopant. Accordingly, the counter doped region 125a may be doped with a p-type dopant, and the discharge active portion 212 may be doped with an n-type dopant. In this case, the PN diode by the counter doped region 125a and the discharge active portion 112 may be disposed blocking a current flowing from the connection doped region 105b to the lower interconnection 140a. Also, in this case, the dummy transistor DTR may be a PMOS transistor.

FIGS. 6A to 6E are cross-sectional views illustrating a method of fabricating a semiconductor device according to an exemplary embodiment of the inventive concept.

Figure 6A:
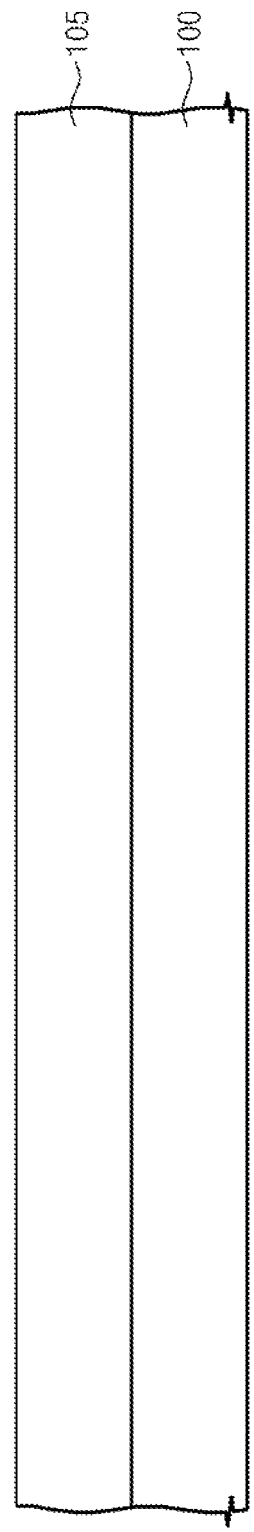
FIGS. 6A to 6E are cross-sectional views illustrating a method of fabricating a semiconductor device according to an exemplary embodiment of the inventive concept.
Figure 6B:
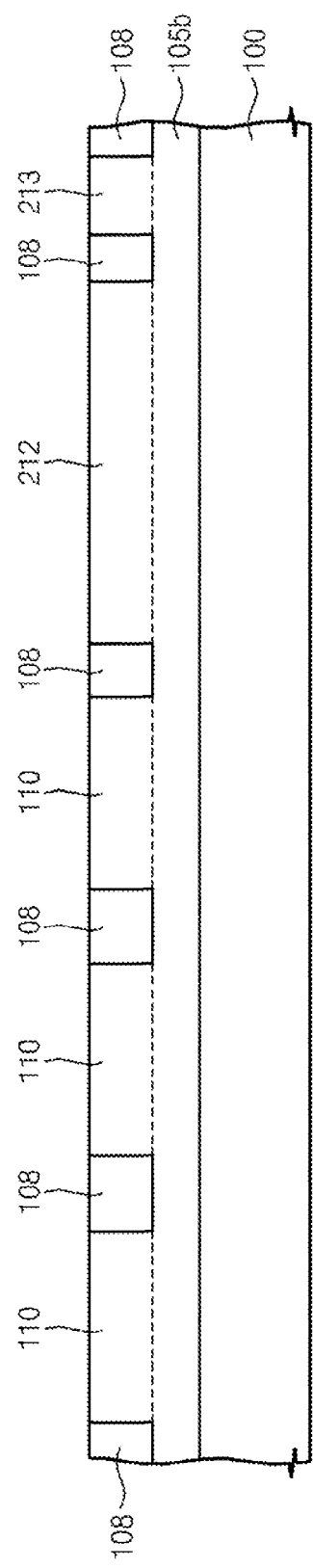

Referring to FIGS. 6A and 6B, a first-type dopant may be ion-implanted into a semiconductor substrate 100 forming a well region 105. A device isolation pattern 108 may be formed in the well region 105 defining a plurality of electrode active portions 110, a discharge active portion 212 and a landing active portion 213. Each of the active portions 110, 212 and 213 may correspond to a portion of the semiconductor substrate 100 surrounded by the device isolation pattern 108. When the device isolation pattern 108 is formed in the well region 105, the active portions 110, 212 and 213 are doped with the first-type dopant. A portion of the well region 105 located under the device isolation pattern 108 and the active portions 110, 212 and 213 may correspond to a connection doped region 105b described with reference to FIG. 4.

Figure 6C:
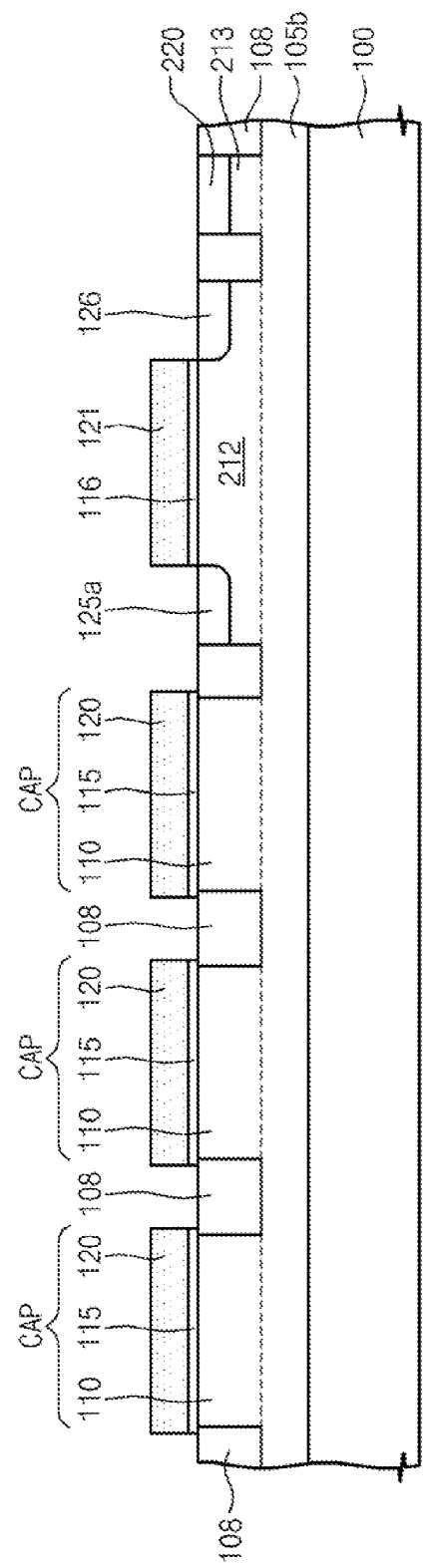

Referring to FIG. 6C, a capacitor-dielectric layer 115 is formed on the entire surface of the semiconductor substrate 100, and an electrode conductive layer is formed on the capacitor-dielectric layer 115. The electrode conductive layer and the capacitor-dielectric layer 115 are sequentially patterned forming a plurality of capping electrodes 120 and a dummy gate electrode 121. The capping electrodes 120 may be formed respectively on the electrode active portions 110, and the dummy gate electrode 121 may be formed on the discharge active portion 212.

A second-type dopant may be implanted into the discharge active portion 212 at both sides of the dummy gate electrode 121 forming a counter doped region 125a and a dummy doped region 126. The counter doped region 125a and the dummy doped region 126 may be formed simultaneously. The first-type dopant may be implanted into the landing active portion 213 forming a heavily-doped region 220. The heavily-doped region 220 may be formed after the forming of the counter and dummy doped regions 125a and 126. According to an exemplary embodiment, the counter and dummy doped regions 125a and 126 may be formed after the forming of the heavily-doped region 220.

Figure 6D:
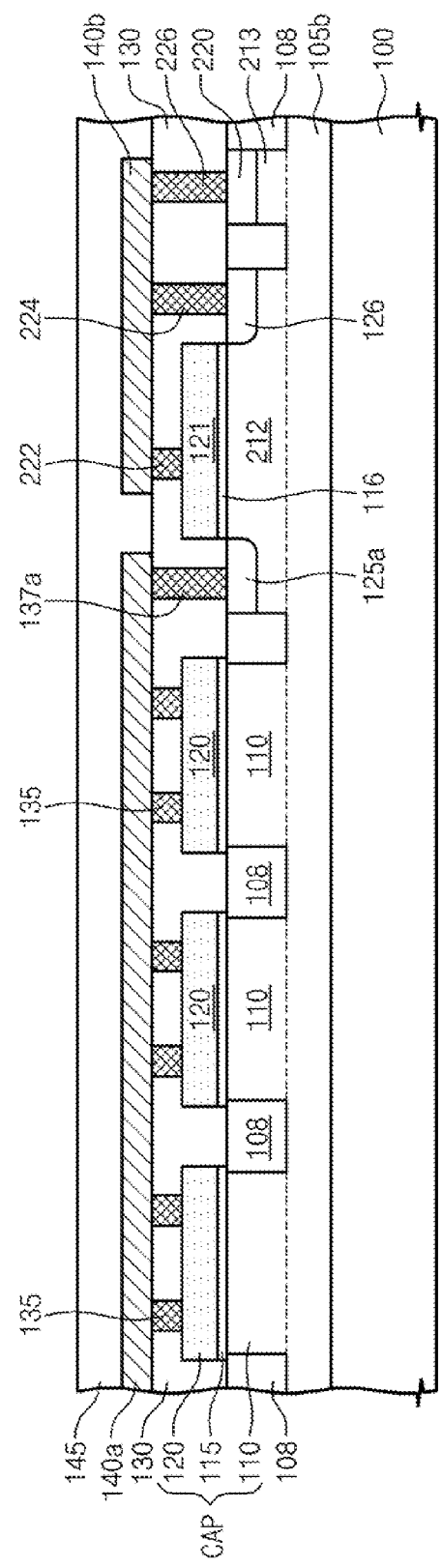

Referring to FIG. 6D, a lower interlayer dielectric 130 may be formed on the entire surface of the semiconductor substrate 100. As described above with respect to FIGS. 1-3, the lower interlayer dielectric 130 may include an oxide layer (e.g., an oxide layer formed through a PECVD process).

Electrode contact plugs 135, a discharge contact plug 137a, a first contact plug 222, a second contact plug 224 and a third contact plug 226 may be formed such that they pierce the lower interlayer dielectric 130. The electrode contact plugs 135 respectively contact the capping electrodes 120, and the discharge contact plug 137a contacts the counter doped region 125a. The first contact plug 222 contacts the dummy gate electrode 121, and the second contact plug 224 contacts the dummy doped region 126. The third contact plug 226 contacts the landing active portion 213, particularly to the heavily-doped region 220. The lower interlayer dielectric 130 may be patterned forming contact holes, and the contact plugs 135, 137a, 222, 224 and 226 may be formed filling the contact holes.

Thereafter, a lower interconnection 140a and a local interconnection 140b are formed on the lower interlayer dielectric 130 such that they are laterally spaced apart from each other. The lower interconnection 140a contacts the top surfaces of the electrode contact plugs 135 and the top surface of the discharge contact plug 137a. The local interconnection 140b may contact the top surfaces of the first, second and third contact plugs 222, 224 and 226. The lower interconnection 140a and the local interconnection 140b may be formed through a patterning process.

A first upper interlayer dielectric 145 may be formed on the lower interconnection 140a, the local interconnection 140b and the lower interlayer dielectric 130. The material and/or characteristics of the first upper interlayer dielectric 145 are the same as those described above with respect to FIGS. 1-3, and thus a description thereof will be omitted for conciseness.

Figure 6E:
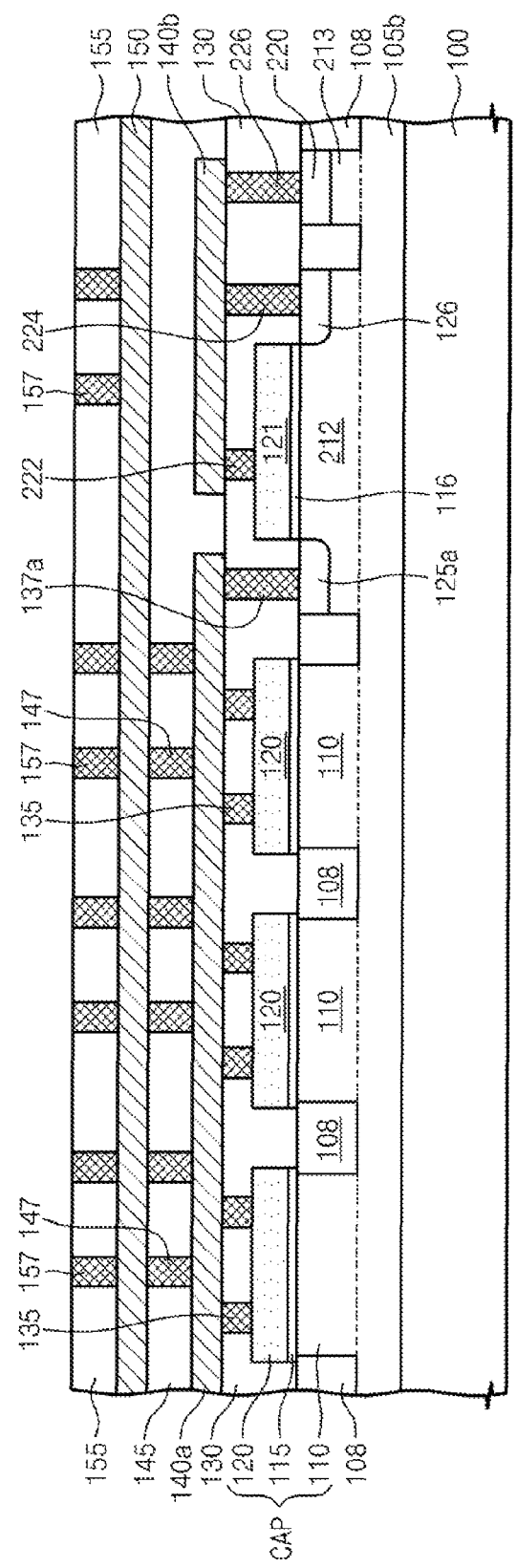

Referring to FIG. 6E, at least one first interconnection contact plug 147 may be formed and may connect to the lower interconnection 140a through the first upper interlayer dielectric 145, and a first upper interconnection 150 may be formed on the first upper interlayer dielectric 145 and may contact the top surface of the first interconnection contact plug 147.

A second upper interlayer dielectric 155 may be formed on the first upper interconnection 150 and the first upper interlayer dielectric 145. At least one second interconnection contact plug 157 may be formed and may contact the first upper interconnection 150 through the second upper interlayer dielectric 155. Thereafter, a second upper interconnection 160 of FIG. 4 may be formed. Accordingly, the semiconductor device of FIG. 4 can be implemented. The methods for forming the first interconnection contact plug 147, the first upper interconnection 150, the second upper interlayer dielectric 155, the second interconnection contact plug 157 and the second upper interconnection 160 may be the same as those described above with respect to FIGS. 1-3.

In the above-described semiconductor device fabrication method, parasitic charges may be generated by the plasma-based semiconductor processes among the subsequent semiconductor processes after the forming of the capping electrodes 120. The parasitic charges may be accumulated in the capping electrodes 120. The parasitic charges in the capping electrode 120 may be discharged through the lower interconnection 140a and the discharge contact plug 137a. The parasitic charges are discharged through the discharge contact plug 137a and the lower interconnection 140a lowermost among the stacked interconnections, thereby minimizing the discharge path of the parasitic charges. Accordingly, a semiconductor device with high reliability can be implemented.

As described above with respect to FIGS. 1-3, the parasitic charges may be discharged during the performing of the plasma-based subsequent process. However, the inventive concept is not limited thereto. The parasitic charges may be discharged after the performing of the plasma-based subsequent process.

According to the semiconductor device described above, the parasitic charges, which may be present in the capping electrodes, may be discharged through the lower interconnection and the discharge contact plug. Accordingly, a semiconductor device with high reliability can be implemented. Also, the parasitic charges are discharged through the lower interconnection and the discharge contact plug contacting the counted doped region, thereby minimizing the discharge path of the parasitic charges. The parasitic charges can be discharged rapidly.

The above-disclosed subject matter is to be considered illustrative and not restrictive, and the appended claims are intended to cover all such modifications, enhancements, and other embodiments, which fall within the true spirit and scope of the inventive concept.

What is claimed is:

1. A method of fabricating a semiconductor device, comprising:
    forming a well region, doped with a first-type dopant, in a semiconductor substrate;
    defining a discharge active portion and a plurality of electrode active portions by forming a device isolation pattern in the well region;
    forming a capacitor-dielectric layer on each of the electrode active portions;
    covering the electrode active portions with a plurality of capping electrodes on the capacitor-dielectric layer;
    forming a counter doped region, doped with a second-type dopant, in the discharge active portion;
    covering a surface of the semiconductor substrate with a lower interlayer dielectric;
    forming an electrode contact plug contacting each of the capping electrodes;
    forming a discharge contact plug contacting the counter doped region; and
    forming a lower interconnection on the lower interlayer dielectric contacting the electrode contact plug and the discharge contact plug.

2. The method of claim 1, wherein the lower interlayer dielectric is formed covering an entire surface of the semiconductor substrate.

3. The method of claim 1, wherein the electrode contact plug is formed contacting each of the capping electrodes through the lower interlayer dielectric and the discharge contact plug is formed contacting the counter doped region through the lower interlayer dielectric.

4. The method of claim 1, wherein in an operation mode:
    a first voltage is applied to the well region and a second voltage different from the first voltage is applied to the lower interconnection;
    the counter doped region and the discharge active portion form a PN junction; and
    a reverse bias is provided to the PN junction by the first voltage and the second voltage.

5. The method of claim 1, wherein parasitic charges in the capping electrodes are discharged through one or more of the lower interconnection, the discharge contact plug, the counter doped region, or the discharge active portion.

6. The method of claim 5, wherein the parasitic charges are generated during plasma-based processes performed after forming the capping electrodes.

7. The method of claim 1, wherein after the forming of the lower interconnection, the method further comprises:

forming an upper interlayer dielectric on the semiconductor substrate;

forming an interconnection contact plug connecting to the lower interconnection through the upper interlayer dielectric; and forming an upper interconnection on the upper interlayer dielectric.

8. The method of claim 1, further comprising:

forming a dummy gate dielectric layer and a dummy gate electrode sequentially stacked on the discharge active portion; and forming a dummy doped region, doped with the second-type dopant, in the discharge active portion at a first side of the dummy gate electrode, wherein the counter doped region is formed at a second side of the dummy gate electrode, and the counter doped region is formed substantially simultaneously with the dummy doped region.

9. The method of claim 8, wherein the device isolation pattern is formed such that a landing active portion is defined in the well region, wherein the landing active portion is spaced apart from the electrode active portions and the discharge active portion, the method further comprising:

forming first, second and third contact plugs connected respectively to the dummy gate electrode, the dummy doped region and the landing active portion through the lower interlayer dielectric; and forming a local interconnection on the lower interlayer dielectric, wherein the local interconnection is connected to the first, second and third contact plugs and is laterally spaced apart from the lower interconnection.

* * * * *